United States Patent [19]
Pelc et al.

[11] Patent Number: 5,653,233
[45] Date of Patent: Aug. 5, 1997

[54] METHOD AND APPARATUS FOR IMPROVED TEMPORAL RESOLUTION IN DYNAMIC MRI

[75] Inventors: Norbert J. Pelc, Los Altos; Jill O. Fredrickson, Menlo Park, both of Calif.

[73] Assignee: The Board of Trustees of the Leland Stanford Junior University, Palo Alto, Calif.

[21] Appl. No.: 514,292

[22] Filed: Aug. 11, 1995

[51] Int. Cl.$^6$ .................................................. A61B 5/00
[52] U.S. Cl. ...................... 128/653.2; 128/653.3; 128/653.1; 324/306; 324/309
[58] Field of Search .................... 128/653.2, 653.3, 128/653.1; 324/306, 309

[56] References Cited

PUBLICATIONS

Fredrickson, et al., Temporal Resolution Improvement In Dynamic Imaging, Abstract of Scientific Presentation, Society of Magnetic Resonance Third Scientific Meeting, Aug. 1995, 1 page.

Hu, et al., Reduction Of Field Of View For Dynamic Imaging, Magnetic Resonance in Medicine, vol. 31, 1994, pp. 691–694.

Fredrickson, et al., Time–Resolved MR Imaging By Automatic Data Segmentation, Journal of Magnetic Resonance in Imaging, vol. 4, No. 2, Mar./Apr. 1994, pp. 190–196.

*Primary Examiner*—Marvin M. Lateef
*Assistant Examiner*—Eleni Mantis Mercader
*Attorney, Agent, or Firm*—Townsend and Townsend and Crew LLP; Henry K. Woodward

[57] ABSTRACT

Temporal resolution in dynamic magnetic resonance imaging is obtained by establishing a representation of static material in the field of view by averaging all signal acquisitions for a full field of view, and Fourier transforming the averaged data to yield an averaged image. The known dynamic portion of the image is set to zero to yield an image restricted to the static portion of the image. The averaged static portion is then inverse transformed to generate a synthetic MR raw data set that is an estimate of the data that would be collected if the object consisted only of the static material. The synthetic data are subtracted from the MR data for each view to eliminate the data for static material. The resulting data then represents the dynamic material which can be individually reconstructed.

25 Claims, 3 Drawing Sheets

FIG. 1B  FIG. 1C  FIG. 1D

METHOD AND APPARATUS FOR IMPROVED TEMPORAL RESOLUTION IN DYNAMIC MRI

BACKGROUND OF THE INVENTION

This invention relates generally to magnetic resonance imaging (MRI), and more particularly the invention relates to improving temporal resolution in dynamic imaging where an imaged object includes both static material and dynamic material.

Magnetic resonance imaging (MRI) is a nondestructive method for the analysis of materials and represents a new approach to medical imaging. It is generally noninvasive and does not involve ionizing radiation. In very general terms, nuclear magnetic moments are excited using magnetic fields which rotate at specific frequencies proportional to the local static magnetic field. The radio frequency signals resulting from the precession of excited spins are received using pickup coils. By manipulating the magnetic fields, an array of signals is provided representing different regions of the volume. These are combined to produce a volumetric image of the nuclear spin distribution of the body.

FIG. 1A is a perspective view, partially in section, illustrating coil apparatus in MR imaging system and FIGS. 1B–1D illustrate field gradients which can be produced in the apparatus of FIG. 1A. Briefly, the uniform static field $B_0$ is generated by the magnet comprising the coil pair 10. A gradient field $G(x)$ is generated by a complex gradient coil set which can be wound on the cylinder 12. An RF field $B_1$ is generated by a saddle coil 14. A patient undergoing imaging would be positioned along the Z axis within in the saddle coil. In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

FIG. 2 is a functional block diagram of conventional imaging apparatus. A computer 20 was programmed to control the operation of the MRI apparatus and process FID signals detected therefrom. The gradient field is energized by a gradient amplifier 22 and the RF coils for impressing an RF magnetic moment at the Larmor frequency is controlled by the transmitter 24 and the RF coils 26. After the selected nuclei have been flipped, the RF coils 26 are employed to detect the FID signal which is passed through the receiver 28 and then through digitizer 30 for processing by computer 20. For the dynamic imaging techniques of the present invention, physiological monitoring and triggering equipment (not shown) may be needed, as known by one skilled in the art.

Most MRI is performed using methods that require multiple experiments, or sequence repetitions, to obtain the desired spatial information. The most commonly used method, Spin Warp imaging, performs for example 128 or 256 sequences, each with a different area of the "phase encoding" lobe. The area of the phase encoding lobe is typically controlled by adjusting the amplitude of the waveform. The echo acquired with each phase encoding area corresponds to a line in the Fourier transform of the image (k-space), which line is acquired being determined by the area of the phase encoding lobe. The method of the present invention is applicable to many other imaging methods. It will be described with respect to Spin Warp imaging first. Examples of applicability to other methods will be described later.

For dynamic imaging, for example for forming images as a function of time in the cardiac cycle, one needs to acquire data with all the necessary phase encoding areas for each portion of the cardiac cycle. One technique for performing dynamic imaging is called segmented k-space scanning, and its operation is shown in FIG. 4. This technique uses a pulse sequence repetition time TR which is very short compared to the cardiac period, on the order of 10 ms. In the example of FIG. 4, in the first cardiac cycle of the scan, the measurements denoted by the open circles are acquired. The system collects data with the first 8 values of the phase encoding lobe; these will contribute to the first time frame of the dynamic image set. The system then acquires the first 8 phase encodes for frame 2, and so on throughout the cardiac cycle. The measurements made during the second cardiac cycle are shown in FIG. 4 as crosses. The system collects phase encodings 9 through 16 for the first time frame, then the same phase encodes for the next time frame, and so on. Thus, eight phase encodes are collected for each time frame during each cardiac cycle. Typically, the scan is on the order of 16 heart cycles long to enable the acquisition of all the needed data; five cycles are shown in FIG. 4. The data that contributes to the second time frame are enclosed in the box in FIG. 4. As can be appreciated, the temporal resolution of this image is 8TR.

The spacing of phase encoding amplitudes is selected so as to achieve the desired field of view (FOV) in the phase encoded direction. If it was known that the object was smaller than the FOV of the acquisition of FIG. 4, the acquisition of FIG. 5 could be used. This acquisition uses half the number of phase encoding amplitudes in each temporal frame but doubles their spacing. This produces the same spatial resolution as in FIG. 4 but over half the FOV. For example, as shown, in the first cycle phase encodings 1, 3, 5 and 7 (relative to those of FIG. 4) are collected for each frame. Because the amount of data is halved, the signal to noise ratio (SNR) is reduced by $\sqrt{2}$. However, because the number of needed phase encodings is halved the number of phase encodings collected for each time frame in each cycle can be halved, and therefore the temporal resolution that can be achieved in the same total acquisition time is improved by a factor of 2, as shown by the narrowed box in FIG. 5. In this example, the odd numbered phase encodings were used. Substantially equivalent results would be obtained if the even numbered phase encodings had been used.

The present invention is directed to improving the temporal resolution of MRI data and images for an object that has known static material and known dynamic material. The article "Reduction of Field of View for Dynamic Imaging" by Hu and Parrish, published in Magnetic Resonance in Medicine, Vol. 31, pp. 691–694, 1994, describes a method for improving the temporal resolution in a dynamic study if the dynamic portion of the object is known to occupy no more than half the full FOV. The difference between any time frame and a first time frame is used to produce a difference image. The difference image is insensitive to the static portion of the object. A $\sqrt{2}$ loss in SNR is expected due to the temporal resolution improvement if the dynamic region occupies half the full FOV. However, this method suffers an additional $\sqrt{2}$ reduction in SNR due to the subtraction operation. In addition, the authors report sensitivity to slow signal variations which cause artifacts. The method of the present invention delivers higher SNR and is less artifact prone than this prior art alternative.

SUMMARY OF THE INVENTION

In accordance with the invention, the temporal resolution of an image of an object achieved in a given amount of imaging time using multiple data acquisitions is improved when it is known that only a portion of the object has significant motion during the imaging time.

In a preferred embodiment, a representation of the static portion of a field of view is obtained. All signal acquisitions for a full field of view are averaged, and the data is then Fourier transformed to yield an averaged image. The known dynamic portion of the image is set to zero to yield an image restricted to the static portion of the image. The averaged static portion is then inverse transformed to generate a synthetic MR raw data set that is an estimate of the data that would be collected if the object consisted only of the static materials. The synthetic data is then subtracted from the MR data for each view to eliminate the data for static material. The resulting data then represents the dynamic material which can then be individually reconstructed.

In a spin warp implementation, if the dynamic portion of the FOV is half of the acquisition FOV, the phase encoding and data acquisition uses half the number of phase encoding amplitudes in alternation in adjacent frames. For example, the first frame of an acquisition cycle might use phase encodings 1, 3, 5 and 7 and the second frame uses phase encodings 2, 4, 6 and 8 with subsequent frames continuing to alternate phase encodings.

Advantageously, temporal resolution is improved over a portion of the field of view without increasing the total acquisition time and without suffering aliasing artifacts by properly processing the data for static material. Importantly, because the static material signal is estimated using a large amount of data, the SNR is not inordinately degraded.

This invention and the objects and features thereof will be more readily apparent from the following description and appended claims when taken with the drawings.

BRIEF DESCRIPTION OF THE DRAWINGS

FIGS. 1A–1D illustrate the arrangement of conventional MRI apparatus and magnetic fields generated therein.

DETAILED DESCRIPTION OF THE ILLUSTRATIVE EMBODIMENTS

Figure 1A:
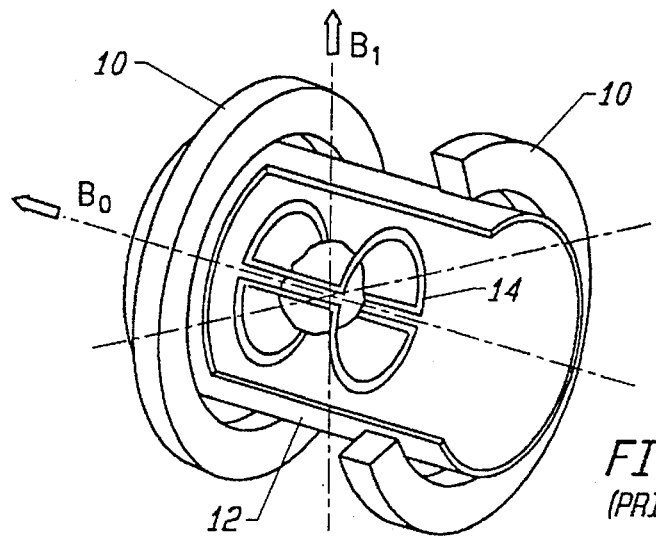
Figure 2:
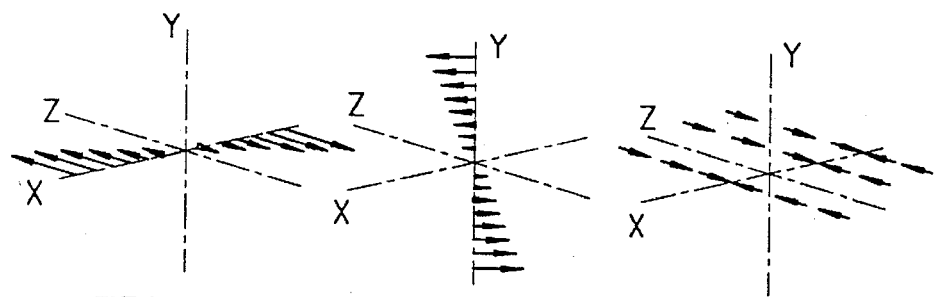
FIG. 2 is a functional block diagram of MRI imaging apparatus.
Figure 2:
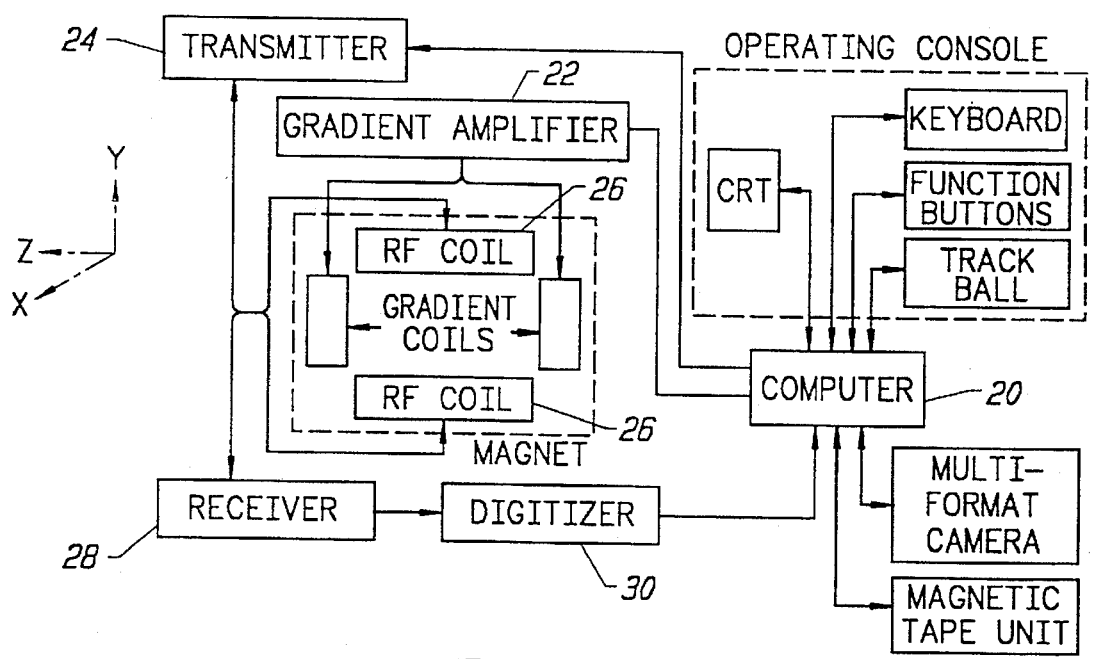
Figure 3:
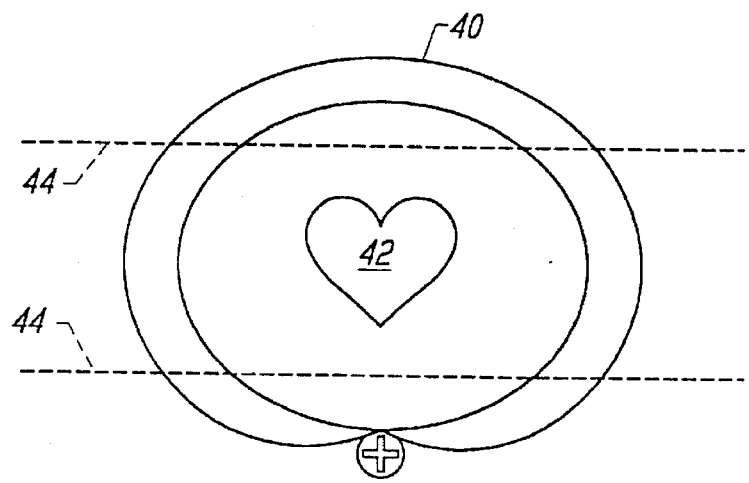
FIG. 3 illustrates a full section field of view through a patient showing static material of the chest and the dynamic heart material within the chest cavity.
Figure 4:
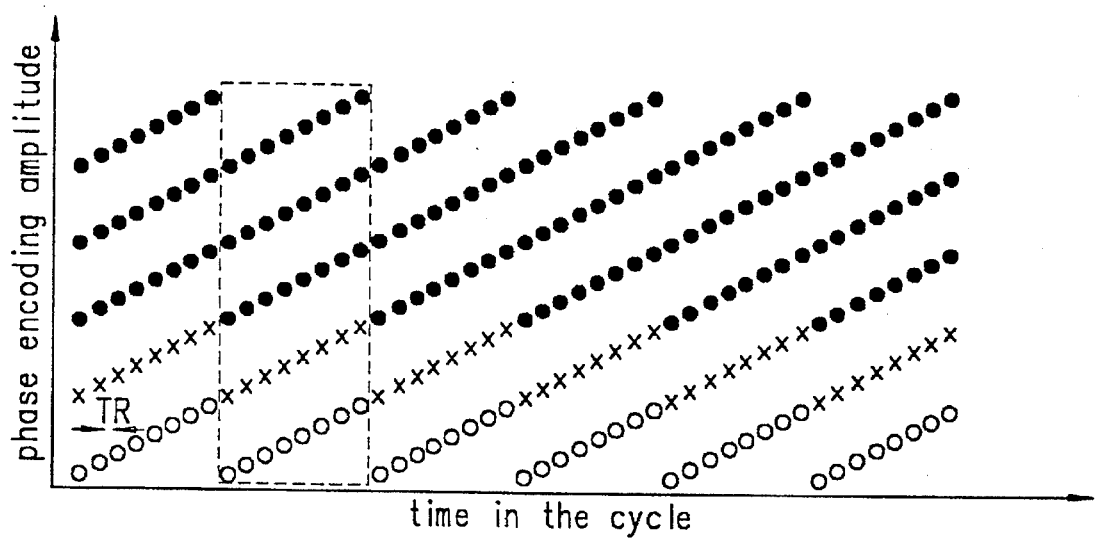
FIG. 4 represents segmented k-space imaging using spin warp phase encoding for a full field of view.
Figure 5:
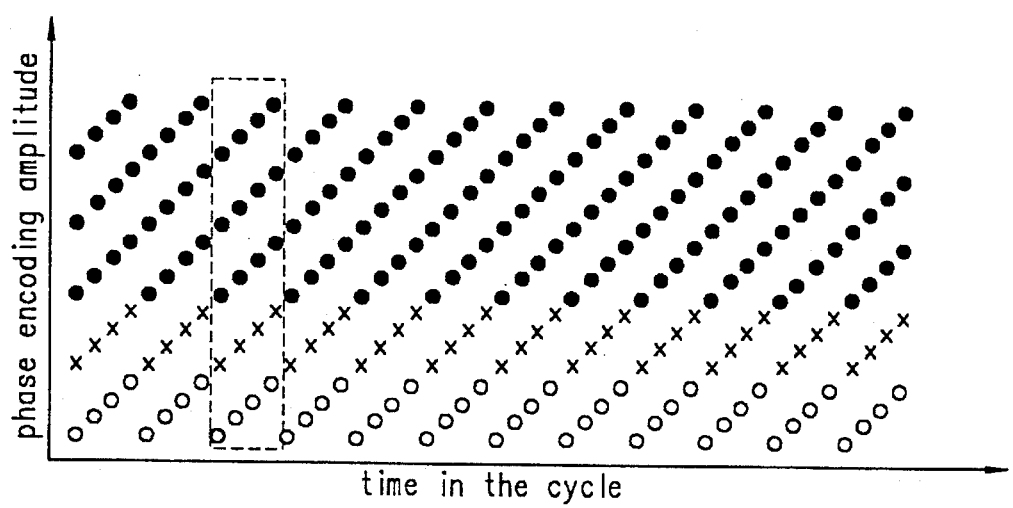
FIG. 5 represents segmented k-space imaging using spin warp phase encoding for a restricted field of view.

FIG. 3 illustrates a full section field of view through a patient showing static material of the chest 40 and the dynamic material of the heart 42 in the chest cavity. The prior art k-space sampling for imaging of the full field of view including both static and dynamic material using spin warp phase encoding is illustrated in FIG. 4. FIG. 5 represents the k-space sampling for imaging of a restricted field of view of one half the full field of view, or the view between dotted lines 44 of the dynamic material of FIG. 3, including heart 42 and limited portions of the static material 40. However, if the acquisition of FIG. 5 is used, the static outer half would be aliased and generate "wrap around" artifacts that would seriously degrade the image, as is well known in the art.

The present invention achieves the temporal resolution of FIG. 5 for an object that occupies the FOV of FIG. 4 but in which it is known that only a portion of the object varies significantly during the cycle.

Figure 7:
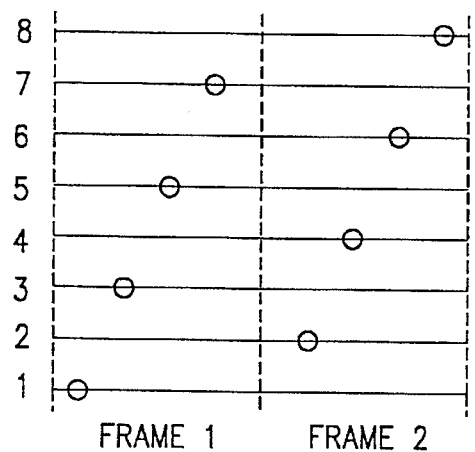

The acquisition strategy of one embodiment of the invention is shown in FIG. 7. At the beginning of the first cycle, the method collects data with phase encodings 1, 3, 5 and 7. Then it employs phase encodings 2, 4, 6 and 8, then 1, 3, 5 and 7, and so on throughout the first cycle. Let the number of times that the views (1, 3, 5 and 7) are employed during the cycle be N. Similarly, the views (2, 4, 6 and 8) are employed N times. In this way, the cycle is divided into 2N portions, each portion having been sampled either with views (1, 3, 5 and 7) or views (2, 4, 6 and 8). During the second motion cycle, the method alternates between views (9, 11, 13 and 15) and (10, 12, 14 and 16). The process continues throughout the scan. As can be seen, for the first ½N of the cycle only the odd views are available. Similarly, for the second ½N of the cycle only even phase encodings are available. If only the data from one ½N portion of the cycle are used to produce an image, only odd views or only even views would be used and spatial aliasing would result.

Figure 6:
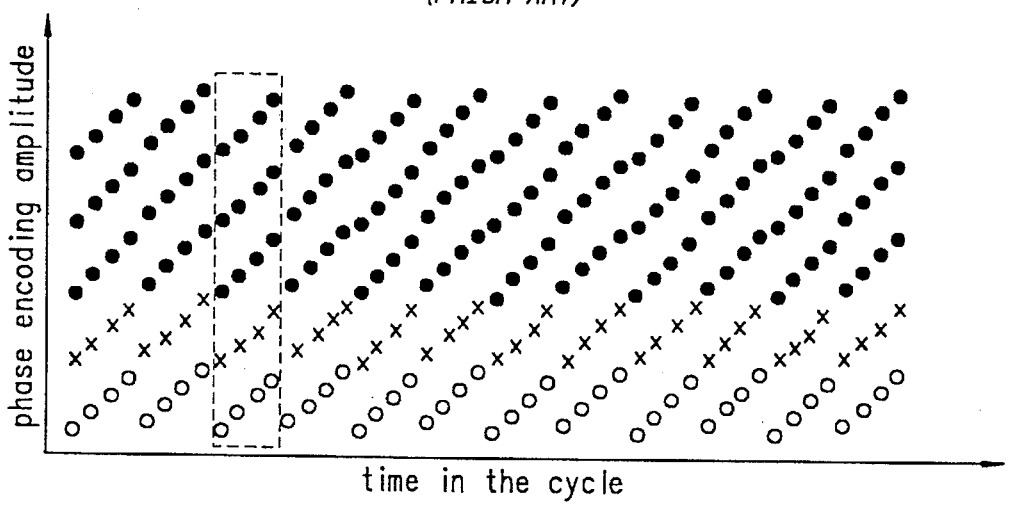
FIGS. 6 and 7 represent segmented k-space imaging using spin warp phase encoding for a restricted field of view in accordance with one embodiment of the invention.

To obtain the desired benefit, a representation of the "static" outer half of the FOV is needed. This can be obtained by reconstructing all the data from FIG. 6. That is, all the acquisitions with each phase encoding amplitude are averaged, and the data are then Fourier transformed to yield an "average" image. The center half of the average image is set to zero to yield an image only of the static outer half of the object. This average outer image is inverse transformed to generate a synthetic MR raw data set that is an estimate of the data that would have been collected if the object had consisted only of the static outer half. If the odd views of the synthetic data set are subtracted from the views collected in the first ½N of the cycle, the resulting data can be reconstructed to produce an image of the center of the FOV during the first time frame. The static outer half does not produce artifacts because the contribution of the outer portion of the object has been removed. Similarly, if the even views of the synthetic data set are subtracted from the views collected in the second ½N of the cycle, an image of the central half of the FOV during the second ½N of the cycle is produced. This procedure can be continued to produce 2N images during the cycle. The temporal resolution is improved over that of FIG. 4 by a factor of 2 without increasing the total acquisition time and without suffering aliasing artifacts as long as the outer half of the FOV is substantially static. As will now be discussed, the SNR is approximately the same as that in FIG. 5, i.e., $\sqrt{2}$ lower than in FIG. 4.

Improved temporal resolution with a reduction of field of view, similar to the objective of the present invention, is discussed by Hu and Parrish, in the aforementioned article. However, Hu and Parrish subtract kspace data for a base full FOV image for example the data for the first 1/N cycle (the first two ½N portions) from corresponding k-space data for each ½N portion. The resultant data from the subtraction is then Fourier transformed to form a difference image of the restricted field of view. However, the subtraction technique of Hu and Parrish reduces the SNR in the dynamic region by a factor of $\sqrt{2M-1}$ where 1/M is the fraction of the full FOV the dynamic region occupies (M=2, or half the FOV in this discussion). The method of the invention using generated synthetic MR data reduces the SNR in the dynamic region by a factor of $$\sqrt{M\left\{1-\left(\frac{1-1/M}{N}\right)\right\}}$$

The term in parentheses is the cost of having to estimate and correct for the presence of the static portion of the FOV. For values of $N \gg 1$, the SNR is reduced by approximately $\sqrt{M}$, which is what is expected from an acquisition using only $1/M$ of the original data. For small values of N (or less temporal resolution) the SNR of the dynamic region may improve, but the method can have difficulties with motion artifacts that detract from temporal resolution. Better SNR in the static region will result in most cases because the reference image used in the invention likely includes more data. Further, the method in accordance with the invention is relatively immune to system drift and small motions in the static region due to the averaging of data used to form the actual dynamic images.

An important application of the invention is cardiac imaging, as noted above. In imaging the heart, the dynamic portion of the object is generally only a fraction of the total object size. The chest wall is almost static. If there are regions with some signal variation during the cycle in the outer half, for example blood vessels with pulsatile flow, the signal variations will cause some spatial aliasing. However, in many cases that will be acceptable.

The invention can be applied to image other cyclical variations, for example, motion as a function of time in the respiration cycle. Another application is called "functional MRI" (fMRI). In fMRI, the subject is presented with cyclically varying stimuli, for example flashing lights during one period of time and no lights during another period. The cycle therefore consists of a length of time of visual stimulation and a length of time of no stimulation. Images are collected during many cycles of stimulation, and the images are analyzed to identify the portions of the object (e.g., the brain) whose signal varies in correlation with the stimulus. The regions of stimulated response are only a small portion of the entire object, and much is known about the possible location of these regions. The present invention can be used to improve the temporal resolution in fMRI.

While the invention has been described with respect to segmented k-space imaging, it can also be used in other imaging strategies. One method for dynamic imaging is called TRIADS, and is described in J. O. Fredrickson and N. J. Pelc, "Time Resolved MR Imaging by Automatic Data Segmentation," Journal of Magnetic Resonance Imaging 4, pp. 189–196, 1994. In this application, the selection of phase encoding amplitudes is made using real time information about the cycle. The invention is incorporated into TRIADS by modifying the mapping of motion cycle to phase encoding amplitude. For example, in analogy to FIG. 6, the first ½N of the cycle is mapped to the odd views, the next ½N of the cycle is mapped to the even views, and so on.

The invention can also be applied to techniques other than spin warp imaging. One MR imaging strategy collects Fourier transform data as spirals in Fourier transform space (k-space). Often, multiple interleaved spiral trajectories are employed to obtain the necessary spatial resolution and FOV. The interleaved trajectories are generally obtained by rotating the initial trajectory in k-space by (360/L) degrees, where L is the number of interleaves. The k-space distance between interleaved trajectories, and therefore the number L, determines the field of view. The invention can be used to improve the temporal resolution in dynamic studies with interleaved spiral trajectories in a manner analogous to the way it is used in Spin Warp imaging. Similarly, the invention can also be used with interleaved Echo Planar Imaging (EPI).

The key aspect of all these applications is as follows. The dynamic cycle to be imaged is divided into portions or time frames and k-space data are acquired for each time frame. The k-space sampling within each time frame is not sufficient to portray the full FOV. However, the sampling in one time frame can be interleaved with those in other time frames so that, together, they can adequately portray the full FOV.

The described implementation assumed that the dynamic portion of the object was in the center of the FOV, with the outer portion of the FOV being static. It can also be employed if the dynamic portion is not in the center. This can be accomplished by premultiplying all the measured data by appropriate linearly varying (in k-space) phase shifts. As is known in the art, linear phase shifts in k-space produce spatial shifts in image space. The phase shifts are selected so as to translate the dynamic portion of the object into the center of the shifted FOV. Further, it may be desired to produce images that contain both the static and dynamic portions of the FOV. This can be produced by inserting the dynamic inner FOV images into the estimated average image for the outer portions.

Thus, while the invention has been described with reference to specific embodiments, the description is illustrative of the invention and is not to be construed as limiting the invention. Various applications and modifications may occur to those skilled in the art without departing from the true spirit and scope of the invention as defined by the appended claims.

What is claimed is:

1. A method for magnetic resonance (MR) imaging of an object which occupies a full field of view and within which a portion exhibits time varying signal, said dynamic portion occupying substantially only a portion of the full field of view, comprising the steps of:

a) obtaining MR data for a plurality of time frames, each time frame composed of subframes, b) combining the data from multiple time frames to obtain data representative of an average image, c) using said data representing an average image to obtain data representing the static portion of the object and d) using the data from the static portion obtained in step c) and the data from one subframe to produce an image of the dynamic portion of the object during said subframe.

2. The method as defined by claim 1 wherein step c) includes a reverse Fourier transform of said image to k-space, and step d) includes Fourier transforming k-space data to image data.

3. The method as defined by claim 2 wherein said magnetic resonance imaging is segmented k-space imaging using spin warp phase encoding.

4. The method as defined by claim 3 wherein a plurality of phase encoding amplitudes are employed in step a).

5. The method as defined by claim 4 wherein alternate phase encoding amplitudes are employed in step d).

6. The method as defined by claim 5 wherein alternative phase encoding amplitudes are odd number frames employing odd number encoding amplitudes and even number frames employing even number phase encoding amplitudes.

7. The method as defined by claim 5 wherein each frame employs every Nth phase encoding amplitude where 1/N is the area of dynamic material in a field of view.

8. The method as defined by claim 2 wherein said magnetic resonance imaging is TRIADS and in which a motion cycle is mapped to phase encoding amplitude.

9. The method as defined by claim 2 wherein Fourier transform data are collected as spirals in Fourier transform space.

10. The method as defined by claim 2 wherein said imaging is cardiac imaging.

11. The method as defined by claim 2 wherein said imaging is functional MRI.

12. The method as defined by claim 2 wherein said imaging is based on respiration cycle.

13. The method as defined by claim 1 wherein said dynamic material is centrally located in said field of view.

14. The method as defined by claim 1 wherein said dynamic material is offset from a center of said field of view, and all measured data are multiplied by linearly varying phase shifts in k-space.

15. The method as defined by claim 1 wherein a plurality of phase encoding amplitudes are employed in step a).

16. The method as defined by claim 15 wherein alternate phase encoding amplitudes are employed in step d).

17. The method as defined by claim 15 wherein each frame employs every Nth phase encoding amplitude where 1/N is the area of dynamic material in a field of view.

18. Apparatus for dynamic magnetic resonance (MR) imaging of an object which occupies a full field of view and within which a dynamic portion exhibits time varying signal, said dynamic portion occupying substantially only a portion of the full field of view, said apparatus comprising:

a) means obtaining MR data for a plurality of time frames, each time frame composed of subframes, b) means combining the data from multiple time frames to obtain data representative of an average image, c) means using said data representing an average image to obtain data representing the static portion of the object, and d) means using the data from the static portion obtained in step c) and the data from one subframe to produce an image of the dynamic portion of the object during said subframe.

19. Apparatus for magnetic resonance imaging known dynamic material in a field of view in an object having static material comprising:

a) means establishing a magnetic field through said object, b) means applying a plurality of phase encoding amplitude pulses to said object for segmented k-space imaging and spin warp encoding, c) means obtaining magnetic resonance data for a plurality of frames of all material in said field of view, d) means averaging all magnetic resonance data to obtain an average image, e) means setting the dynamic material of said average image to zero to obtain an image of static material, f) means transforming said image of static material to generate a synthetic magnetic resonance data set of static data, g) means subtracting said synthetic magnetic resonance data set from said magnetic resonance data for each of said plurality of frames to produce magnetic resonance data sets for dynamic material in each frame, and h) means transforming said data sets for dynamic material to frame images.

20. Apparatus as defined by claim 19 wherein said f) means includes performing a reverse Fourier transform of said image to k-space, and said f) means includes Fourier transforming k-space data to image data, and said h) means includes Fourier transforming k-space data to image data.

21. Apparatus as defined by claim 20 wherein the magnetic resonance imaging is segmented k-space imaging using spin warp phase encoding.

22. Apparatus as defined by claim 20 wherein a plurality of phase encoding amplitudes are employed by said a) means.

23. Apparatus as defined by claim 22 wherein alternate phase encoding amplitudes are employed by said e) means.

24. Apparatus as defined by claim 23 wherein alternative phase encoding amplitudes are odd number frames employing odd number encoding amplitudes and even number frames employing even number phase encoding amplitudes.

25. Apparatus as defined by claim 23 wherein each frame employs every Nth phase encoding amplitude where 1/N is the area of dynamic material in a field of view.

* * * * *